US009932691B2

(12) United States Patent
Raming et al.

(10) Patent No.: US 9,932,691 B2
(45) Date of Patent: Apr. 3, 2018

(54) METHOD FOR GROWING A SINGLE CRYSTAL BY CRYSTALLIZING THE SINGLE CRYSTAL FROM A FLOAT ZONE

(71) Applicant: Siltronic AG, Burghausen (DE)

(72) Inventors: Georg Raming, Tann (DE); Ludwig Altmannshofer, Lenggries (DE); Gundars Ratnieks, Burghausen (DE); Martin Moeller, Haiming (DE); Frank Muemmler, Emmerting (DE)

(73) Assignee: SILTRONIC AG, Burghausen (DE)

( * ) Notice: Subject to any disclaimer, the term of this patent is extended or adjusted under 35 U.S.C. 154(b) by 0 days.

(21) Appl. No.: 14/945,840

(22) Filed: Nov. 19, 2015

(65) Prior Publication Data

US 2016/0177469 A1    Jun. 23, 2016

(30) Foreign Application Priority Data

Dec. 18, 2014   (DE) .................. 10 2014 226 419

(51) Int. Cl.
| C30B 13/26 | (2006.01) |
| C30B 13/32 | (2006.01) |
| C30B 13/20 | (2006.01) |
| C30B 29/06 | (2006.01) |

(52) U.S. Cl.
CPC ............. *C30B 13/32* (2013.01); *C30B 13/20* (2013.01); *C30B 13/26* (2013.01); *C30B 29/06* (2013.01)

(58) Field of Classification Search
CPC ......... C30B 13/00; C30B 13/06; C30B 13/08; C30B 13/16; C30B 13/20; C30B 13/26; C30B 13/28; C30B 13/30; C30B 13/32; C30B 29/00; C30B 29/02; C30B 29/06; C30B 30/00; C30B 30/04
USPC ........ 117/11, 13–15, 30, 32–34, 49–52, 928, 117/931–932
See application file for complete search history.

(56) References Cited

U.S. PATENT DOCUMENTS

| 3,397,042 A * | 8/1968 | Hunt .................. C01B 33/02 117/221 |
| 2003/0024468 A1* | 2/2003 | Altmannshofer ....... C30B 13/26 117/26 |
| 2003/0024469 A1 | 2/2003 | Altmannshofer et al. |
| 2003/0192470 A1 | 10/2003 | Knobel et al. |
| 2005/0188918 A1 | 9/2005 | Abrosimov et al. |
| 2009/0223949 A1 | 9/2009 | Altmannshofer et al. |
| 2010/0107968 A1* | 5/2010 | Vaabengaard ........ C30B 13/00 117/52 |
| 2011/0314869 A1* | 12/2011 | Riemann ............... C30B 13/20 65/33.2 |

FOREIGN PATENT DOCUMENTS

| DE | 25 38 831 A1 | 3/1977 |
| DE | 2538831 A1 | 3/1977 |
| DE | 102011122381 A1 | 6/2012 |
| JP | 2008266102 A | 11/2008 |
| WO | 2008125104 A1 | 10/2008 |

* cited by examiner

*Primary Examiner* — Kenneth A Bratland, Jr.
(74) *Attorney, Agent, or Firm* — Brooks Kushman P.C.

(57) ABSTRACT

A single crystal is grown in a float zone which is inductively heated and the crystallizing single crystal is rotated in a direction of rotation which is periodically reversed at intervals in accordance with an alternating plan, wherein a dwell time during which the single crystal is in a state of rest because of the reversal of the direction of rotation is limited to no more than 60 ms.

6 Claims, 3 Drawing Sheets

METHOD FOR GROWING A SINGLE CRYSTAL BY CRYSTALLIZING THE SINGLE CRYSTAL FROM A FLOAT ZONE

CROSS-REFERENCE TO RELATED APPLICATIONS

This application claims priority to German Patent Application No. 10 2014 226 419.7 filed Dec. 18, 2014 which is herein incorporated by reference.

BACKGROUND OF THE INVENTION

1. Field of the Invention

The present invention pertains to a method for growing a single crystal by crystallizing the single crystal from a float zone, the float zone being inductively heated and the crystallizing single crystal being rotated in a direction of rotation and the direction of rotation being reversed at intervals in accordance with an alternating plan which severely limits the period of the state of rest between alternating rotations.

2. Description of the Related Art

The invention pertains to the zone melting method or float zone method, or "FZ" method for short. It is often used for producing single crystals from silicon, which in turn are processed further into semiconductor wafers, from which electronic components are produced. Carried out in the classic way, a polycrystalline feed rod is melted at the lower end and a monocrystalline seed crystal is held against the melt and slowly lowered. In the further course of the method, molten material crystallizes on the seed crystal to form a single crystal. The seed crystal and the single crystal are located on a shaft, which is in connection with a drive which allows for the rotation, lifting, and lowering of the shaft. The volume of the melt is increased by further melting and lowering of the polycrystalline feed rod to form a float zone, which extends between the feed rod and the single crystal crystallizing on the seed crystal. The float zone provides the material necessary for the crystallization of the single crystal. Continued melting of the polycrystalline feed rod causes the single crystal to grow until the feed is exhausted.

It is not necessary to use a feed rod as a feed. Instead of a feed rod, fragments or granules may also form the feed. The feed does not necessarily have to be polycrystalline, either. US 2005/0188918 A1 and US 2009/0223949 A1 describe methods in which granules are used as the feed.

It is of advantage to rotate the crystallizing single crystal and to reverse the direction of rotation at intervals in accordance with an alternating plan. This measure, referred to as alternating rotation, brings about a more uniform distribution of dopants in the single crystal and promotes the growth of the single crystal in the desired cylindrical form. US 2003/0024468 A1 describes an alternating rotation that is carried out on the basis of a specific alternating plan.

The float zone is inductively heated and stabilized. For this purpose, an induction heating coil is arranged between the feed and the crystallizing single crystal. The induction heating coil is usually an almost annular flat coil with one turn, and the float zone extends through a central hole in the induction heating coil.

The region of the gap of the induction heating coil where the ends of the turn approach each other and the current supply is located, is critical, because the electromagnetic field generated by the induction heating coil is much stronger there than in the other regions of the induction heating coil. This fact can put at risk the undisturbed progress of the crystallization of the single crystal. In DE 2538831 it is proposed to allow the ends of the turn to overlap in order to reduce the field strength. According to DE 10 2011 122 381 A1, a problem in the crystallization of a conical portion of the single crystal that is caused by the lack of uniformity of the induction heating coil can be avoided by the alternating plan for the alternating rotation providing that the amount of rotation in one direction of rotation is not less than one revolution.

SUMMARY OF THE INVENTION

An object of the present invention is to propose a further improvement that is aimed at countering disadvantageous consequences of an excessive field strength in the region of the gap and the current supply of the induction heating coil. These and other objects are achieved by a method for growing a single crystal by crystallizing the single crystal from a float zone, the float zone being inductively heated and the crystallizing single crystal being rotated in a direction of rotation and the direction of rotation being reversed at intervals in accordance with an alternating plan, characterized in that a dwell time during which the single crystal is in a state of rest because of the reversal of the direction of rotation is limited to no more than 60 ms. A limitation of the dwell time to no more than 40 ms is preferred; limitation thereof to no more than 30 ms is particularly preferred.

DETAILED DESCRIPTION OF THE PREFERRED EMBODIMENT(S)

Figure 1:
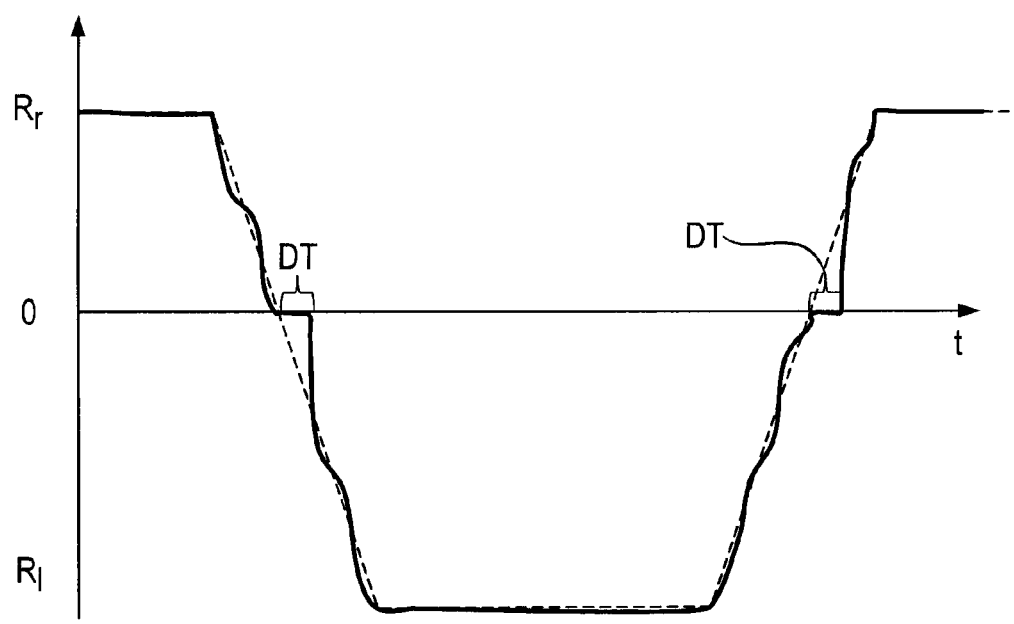
FIG. 1 and FIG. 2 respectively show a diagram with curves depicted by broken lines, which represent the presetting of the profile of the rotational speed of the drive between the beginning of the deceleration phase and the end of the acceleration phase. The solid line represents the profile of the resultant rotational speed of the single crystal set in motion by the drive.

The limiting of the dwell time of the single crystal in the state of rest pursues the aim of minimizing the time during which part of the float zone and the single crystal adjacent thereto is exposed on one side to the excessive field strength. A comparatively long dwell time increases the risk of the single crystal being melted back at its upper periphery below the gap and the current supply.

In the ideal case, the dwell time would be negligible. In practice, this is not so, because resistances, for example frictional forces in the bearing of the shaft and associated with the transmission of force from the drive to the shaft, first have to be overcome before the shaft, and consequently the single crystal, are actually set in motion after a signal to accelerate is transmitted to the drive.

A preferred measure for limiting the dwell time of the single crystal in the state of rest is that of controlling the rotational speed of a drive initiating the rotational movement of the single crystal during an acceleration phase in accordance with the presetting of a speed profile, as a result of which the increase in the rotational speed of the drive at the beginning of the acceleration phase, and at least during a time period of no less than ¼ of the acceleration phase, is no less than 3000 revolutions/min per minute. The increase in the rotational speed of the drive is preferably linear during this time period and brings about the effect that the rotational movement of the single crystal also actually recommences more quickly. With preference, the increase in the rotational speed of the drive during this time period is no less than 3500 revolutions/min per minute ($rpm^2$), with particular preference no less than 3800 $rpm^2$. However, an increase in the rotational speed of the drive of over 4500 $rpm^2$ entails the risk that, because of its effect, material of the float zone is forced from the crystallizing single crystal.

The acceleration phase is preceded by a deceleration phase, during which the drive is controlled in accordance with the presetting of a speed profile by which the rotational speed of the drive is lowered until the state of rest of the single crystal is reached. The decrease in the rotational speed of the drive according to the presetting is preferably likewise linear.

The amount of the increase in the rotational speed of the drive according to the presetting of the speed profile at the beginning of the acceleration phase, during the time period of at least ¼ of the acceleration phase, is preferably greater than the amount of the decrease in the rotational speed of the drive according to the presetting of the speed profile during a corresponding time period before the end of the preceding deceleration phase.

The increase in the speed of the drive of no less than 3000 $rpm^2$ according to the presetting of the speed profile of the drive at the beginning of the acceleration phase also has the effect of tending to avoid an overshooting of the rotational movement of the single crystal. In the case of overshooting, the rotational speed of the single crystal is greater for a time than the rotational speed of the drive that is predetermined by the presetting of the speed profile of the drive and then over the course of time oscillates about the value of the presetting. Overshooting is an indication that resistances to the rotational movement of the single crystal have been overcome abruptly.

It is therefore expedient that, when initiating the rotational movement of the drive, the transmission of force from the drive to the shaft holding the single crystal takes place with as little loss as possible and, as far as possible, the force transmitted is only utilized for putting in motion and maintaining the rotational movement of the single crystal. A drive with low-vibration force transmission by means of a belt is preferably provided, and a comparatively high belt tension between a drive shaft and the shaft holding the single crystal is chosen. The belt tension is preferably close to the admissible limit for the mechanical loading of the belt used. Particularly preferred is a belt tension that induces a natural vibration of no less than 100 Hz and no more than 150 Hz in the part of the belt that is under tension when the drive is at a standstill after such a vibration is initiated mechanically, for example by brief impact.

The excessive field strength in the region of the gap and the current supply is preferably limited. Thus, the electrical power that is given off in this region should be no greater than five times the electrical power that is given off by the induction heating coil in regions that are further away from the gap and the current supply.

The induction heating coil is therefore preferably formed as a flat coil with a single turn, the ends of which overlap. Ends that taper at an acute angle and overlap are particularly preferred.

The method according to the invention is particularly advantageous if an induction heating coil with a comparatively small height is used or is required to be used because of a lack of space. The height of the induction heating coil is the greatest distance between the upper side and the underside of the induction heating coil. A small height of the induction heating coil increases the excessive field strength in the region of the gap and the current supply of the induction heating coil. Lack of space occurs in particular if a plate or a crucible is provided over the induction heating coil in order to melt granules and/or fragments there.

The method according to the invention is preferably used for producing single crystals from semiconductor material, with particular preference for producing single crystals from silicon. The feed for producing the float zone is preferably polycrystalline and takes the forms of a rod, fragments and/or granules.

According to FIG. 1, the profile of the rotational speed of the drive according to the presetting is chosen such that the amounts of the decrease in the rotational speed at the end of the deceleration phase and of the increase in the rotational speed at the beginning of the acceleration phase are identical. $R_r$ and $R_l$ denote the directions of rotation of the rotational movements and their rotational speeds in revolutions per minute. The increase in the rotational speed of the drive at the beginning of the acceleration phase lies below 3000 $rpm^2$. It results in a comparatively long dwell time DT of the single crystal in the state of rest and the profile of the rotational speed of the single crystal indicates overshooting during the acceleration phase.

Figure 2:
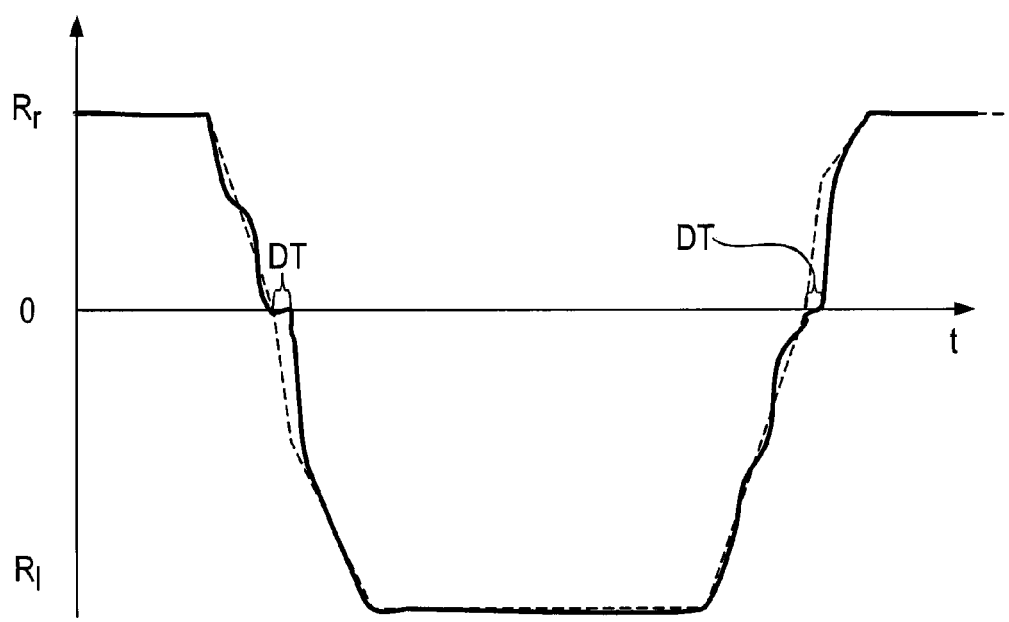

According to FIG. 2, the profile of the rotational speed of the drive is chosen such that the amounts of the decrease in the rotational speed at the end of the deceleration phase and of the increase in the rotational speed at the beginning of the acceleration phase are not identical. $R_r$ and $R_l$ again denote the directions of rotation of the rotational movements and their rotational speeds in revolutions per minute. The amount of the decrease in the rotational speed at the end of the deceleration phase is less than the amount of the acceleration of the rotational speed at the beginning of the acceleration phase. In particular, the increase in the rotational speed of the drive at the beginning of the acceleration phase is 3500 $rpm^2$. It results in a shorter dwell time DT of the single crystal in the state of rest of less than 60 ms and the profile of the rotational speed of the single crystal does not indicate any overshooting during the acceleration phase.

Figure 3:
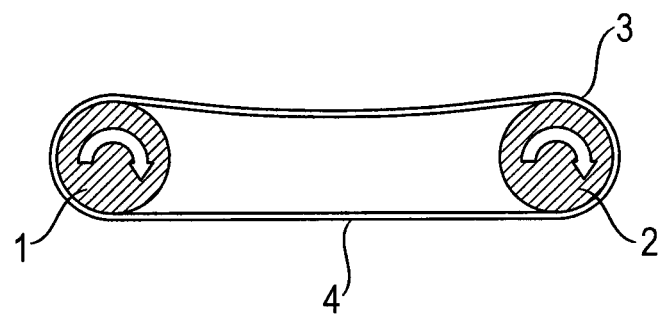
FIG. 3 shows the schematic representation of the force transmission by way of a belt from a drive shaft to a shaft holding a single crystal.

The profile of the rotational speed of the single crystal achieved according to FIG. 2 was achieved by force transmission by means of a belt 3 from a drive shaft 1 to a shaft 2 holding the single crystal (FIG. 3). In the tensioned lower part 4 of the belt 3, a natural vibration of 140 Hz was measured with the drive shaft at a standstill.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for growing a single crystal, comprising crystallizing the single crystal from a float zone, the float zone being inductively heated and the crystallizing single crystal being rotated in a direction of rotation which is reversed at intervals in accordance with an alternating plan, a dwell time during which the single crystal is in a state of rest because of the reversal of the direction of rotation being limited to no more than 60 ms, the method further comprising initiating the rotational movement of the single crystal by a drive, thereby transmitting a force by way of a belt from a drive shaft to a shaft which holds the single crystal, further comprising controlling the rotational speed of the drive during an acceleration phase in accordance with a presetting of a speed profile, such that the increase in the rotational speed of the drive at the beginning of the acceleration phase, during a time period of no less than ¼ of the acceleration phase, is no less than 3000 rpm$^2$, and wherein the amount of increase in the rotational speed of the drive according to the presetting of the speed profile at the beginning of the acceleration phase, during the time period of at least ¼ of the acceleration phase, is greater than the amount of the decrease in the rotational speed of the drive according to the presetting of the speed profile during a corresponding time period before the end of a deceleration phase that precedes a next acceleration phase.

2. The method of claim 1, wherein the float zone is heated with an induction heating coil which is formed as a flat coil with one turn, the ends of which overlap.

3. The method of claim 1, wherein the float zone is heated with an induction heating coil which is formed as a flat coil with one turn and has a height that is no more than 20 mm.

4. The method of claim 1, wherein the state of rest is no more than 40 ms.

5. The method of claim 1, wherein the state of rest is no more than 30 ms.

6. The method of claim 1, wherein the increase in rotational speed during the acceleration phase is not more than 4500 rpm$^2$.

* * * * *